United States Patent
Cheng et al.

(10) Patent No.: US 11,271,155 B2
(45) Date of Patent: Mar. 8, 2022

(54) SUPPRESSING OXIDATION OF SILICON GERMANIUM SELENIUM ARSENIDE MATERIAL

(71) Applicants: International Business Machines Corporation, Armonk, NY (US); Macronix International Co., Ltd., Hsin-chu (TW)

(72) Inventors: Cheng-Wei Cheng, White Plains, NY (US); Huai-Yu Cheng, White Plains, NY (US); I-Ting Kuo, Yorktown Heights, NY (US); Hsiang-Lan Lung, Dobbs Ferry, NY (US)

(73) Assignees: International Business Machines Corporation, Armonk, NY (US); MACRONIX INTERNATIONAL CO., LTD., Hsin-Chu (TW)

( * ) Notice: Subject to any disclaimer, the term of this patent is extended or adjusted under 35 U.S.C. 154(b) by 0 days.

(21) Appl. No.: 16/814,372

(22) Filed: Mar. 10, 2020

(65) Prior Publication Data
US 2021/0288251 A1    Sep. 16, 2021

(51) Int. Cl.
*H01L 45/00* (2006.01)
*H01L 27/24* (2006.01)

(52) U.S. Cl.
CPC ........ *H01L 45/142* (2013.01); *H01L 27/2427* (2013.01); *H01L 45/1253* (2013.01); *H01L 45/144* (2013.01); *H01L 45/16* (2013.01)

(58) Field of Classification Search
CPC .............. H01L 45/142; H01L 45/1253; H01L 27/2427; H01L 45/144; H01L 45/16
See application file for complete search history.

(56) References Cited

U.S. PATENT DOCUMENTS

| | | | |
|---|---|---|---|
| 7,348,205 B2 * | 3/2008 | Campbell | ............. H01L 45/085 257/E45.002 |
| 7,682,976 B2 | 3/2010 | Kim | |

(Continued)

FOREIGN PATENT DOCUMENTS

| | | |
|---|---|---|
| CN | 102386327 A | 3/2012 |
| CN | 110844891 | 2/2020 |

OTHER PUBLICATIONS

S.R. Ovshinsky, "Phase Change Electronic Memories: Towards Cognitive Computing," Encyclopedia of Materials: Science and Technology, Elsevier 2005, p. 1-6.

(Continued)

*Primary Examiner* — Jerome Leboeuf
(74) *Attorney, Agent, or Firm* — L. Jeffrey Kelly; Otterstedt, Wallace & Kammer, LLP

(57) ABSTRACT

An ovonic threshold switch comprises a thin film composed essentially of Si, Ge, Se, As, and an amount of a chalcogen that is effective to passivate oxidation of the composition in the presence of water vapor, wherein the chalcogen is selected from the list consisting of: Te and S. In one or more embodiments, the chalcogen is S. In one or more embodiments, the chalcogen is Te. In one or more embodiments, the effective amount of the chalcogen is greater than 1% by atomic percent. In one or more embodiments, the effective amount of the chalcogen is less than 10% by atomic percent. In one or more embodiments, the composition of matter comprises 10% Si, 15% Ge, 40% Se, 30% As, and 5% chalcogen by atomic percent.

12 Claims, 3 Drawing Sheets

(56) References Cited

U.S. PATENT DOCUMENTS

| | | |
|---|---|---|
| 8,493,772 B2 | 7/2013 | Liu |
| 9,698,344 B2 | 7/2017 | Kau |
| 2008/0089154 A1 | 4/2008 | Terao et al. |
| 2017/0263863 A1 | 9/2017 | Lung et al. |
| 2017/0271581 A1* | 9/2017 | Seong ................. H01L 27/2409 |
| 2018/0051370 A1* | 2/2018 | Pinter ................... C04B 35/653 |
| 2019/0181336 A1 | 6/2019 | Lee |
| 2020/0058871 A1 | 2/2020 | Lee |

OTHER PUBLICATIONS

Derchang Kau et al., "A stackable cross point phase change memory," IEDM 2009. IEEE. Dec. 2009. pp. 617-620.

\* cited by examiner

SUPPRESSING OXIDATION OF SILICON GERMANIUM SELENIUM ARSENIDE MATERIAL

BACKGROUND

The present invention relates to the electrical, electronic, and computer arts, and more specifically, to semiconductor device fabrication.

Phase-change-memory has been proven to be a good candidate for storage class memory and it has been commercialized. For Cross-Point Memory, Phase-change-material (PCM) should incorporate a selector material (e.g., a chalcogenide) as a single storage unit. Phase change memory materials have amorphous and crystalline phases and phase change is accomplished by supplying current through a resistive element (e.g., TiN) to heat the materials briefly and rapidly (to switch to the amorphous phase) or slowly and for a longer time (to switch to the crystalline phase). In the amorphous phase, a PCM has very high resistance; in the crystalline phase, however, a PCM has low resistance. Cross-point memory also incorporates ovonic threshold switches (OTS), which use a chalcogenide material that electrical conduction transitions between an off-state (highly resistive) or on-state (highly conductive), by applying voltage. The OTS material is important to prevent sneak current in cross-point memory array. One requirement is that the off-current of single OTS device should be low enough during the read operation on x-point memory array. (Off current is typically measured at ½ threshold voltage (Vt) of OTS material). For example, if the read current of a cross-point array is 1 micro-amp in a 1000×1000 element array, the off-current at ½ Vt should be lower than 1 nano-amp in a single OTS device.

SUMMARY

Principles of the invention provide techniques for suppressing oxidation of silicon selenium arsenide material. In one aspect, an exemplary composition of matter consists essentially of Si, Ge, Se, As, and an amount of a chalcogen that is effective to passivate oxidation of the composition in the presence of water vapor, wherein the chalcogen is selected from the list consisting of: Te and S. In one or more embodiments, the chalcogen is S. In one or more embodiments, the chalcogen is Te. In one or more embodiments, the effective amount of the chalcogen is greater than 1% by atomic percent. In one or more embodiments, the effective amount of the chalcogen is less than 10% by atomic percent. In one or more embodiments, the composition of matter comprises 10% Si, 15% Ge, 40% Se, 30% As, and 5% chalcogen by atomic percent.

According to another aspect, an exemplary cross point memory apparatus comprises a column wire; a top electrode adjacent to and connected in electrical communication with the column wire; an ovonic threshold switch (OTS) adjacent to and connected in electrical communication with the top electrode; a middle electrode adjacent to and connected in electrical communication with the ovonic threshold switch (OTS); a phase change memory (PCM) adjacent to and connected in electrical communication with the middle electrode; a bottom electrode adjacent to and connected in electrical communication with the PCM; and a row wire adjacent to and connected in electrical communication with the bottom electrode. The OTS comprises a thin film composed of the inventive composition of matter.

According to another aspect, an exemplary method comprises forming a bottom electrode; forming a phase change memory (PCM) adjacent to and connected in electrical communication with the bottom electrode; forming a middle electrode adjacent to and connected in electrical communication with the PCM; forming an ovonic threshold switch (OTS) adjacent to and connected in electrical communication with the middle electrode; and forming a top electrode adjacent to and connected in electrical communication with the OTS. The OTS comprises a thin film composed of the inventive composition of matter.

In view of the foregoing, techniques of the present invention can provide substantial beneficial technical effects. For example, one or more embodiments provide one or more of:

Operation of silicon doped germanium selenium arsenide devices with minimal emission of arsine at steady state.

These and other features and advantages of the present invention will become apparent from the following detailed description of illustrative embodiments thereof, which is to be read in connection with the accompanying drawings.

DETAILED DESCRIPTION

Among potential OTS materials, GeAsSe base material is a good candidate to provide low off-state current. However, GeAsSe alone does not exhibit satisfactory thermal stability in its electrical properties. Thermal stability might be improved by adding some kind of dopant, but the dopant might make the doped material chemically unstable (e.g., reaction between the material with moisture in the air to release gases that change the electrical properties of the OTS material).

Figure 1:
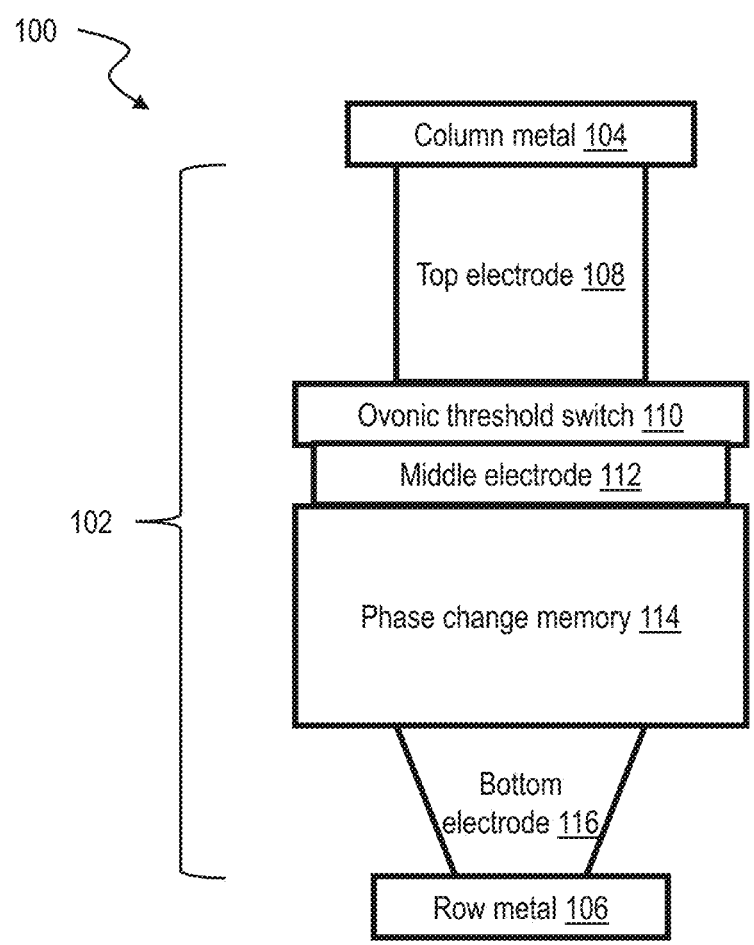
FIG. 1 depicts a phase change memory (PCM) cell according to an exemplary embodiment.

FIG. 1 depicts a phase change memory (PCM) cell 100 according to an exemplary embodiment. The PCM cell 100 includes a memory stack 102 that is electrically connected between column metal 104 and row metal 106. The memory stack 102 includes a top electrode 108, an ovonic threshold switch 110, a middle electrode 112, a phase change memory 114, and a bottom electrode 116. In operation of the PCM cell 100, a column voltage is supplied to the column metal 104 and a row voltage is supplied to the row metal 106. When a difference between the row and column voltages exceeds a threshold voltage of the ovonic threshold switch 110, current flows through the memory stack 102.

For a WRITE cycle, the row and column voltages are set so that the flowing current exceeds a threshold current of the phase change memory 114, and the phase change memory is heated above its phase transition temperature. Once the phase change memory 114 exceeds its phase transition temperature, there are two options: 1) remove the row and column voltages, in which case the current stops flowing and the phase change memory rapidly cools to an amorphous (high resistance) phase; or 2) maintain the row and column voltages for a certain period of time, in which case the current continues flowing and the phase change memory stabilizes in a crystalline (lower resistance) phase.

For a READ cycle, the row and column voltages are set so that the flowing current does not exceed the threshold current; then the current, which varies according to the resistance of the phase change memory 114, is read as the value of the memory cell. Because the resistance of the phase change memory 114 is analog (it varies according to how long the phase change memory is held above the phase transition temperature), PCM cells enable denser data storage than is achievable with older types of memory.

Figure 2:
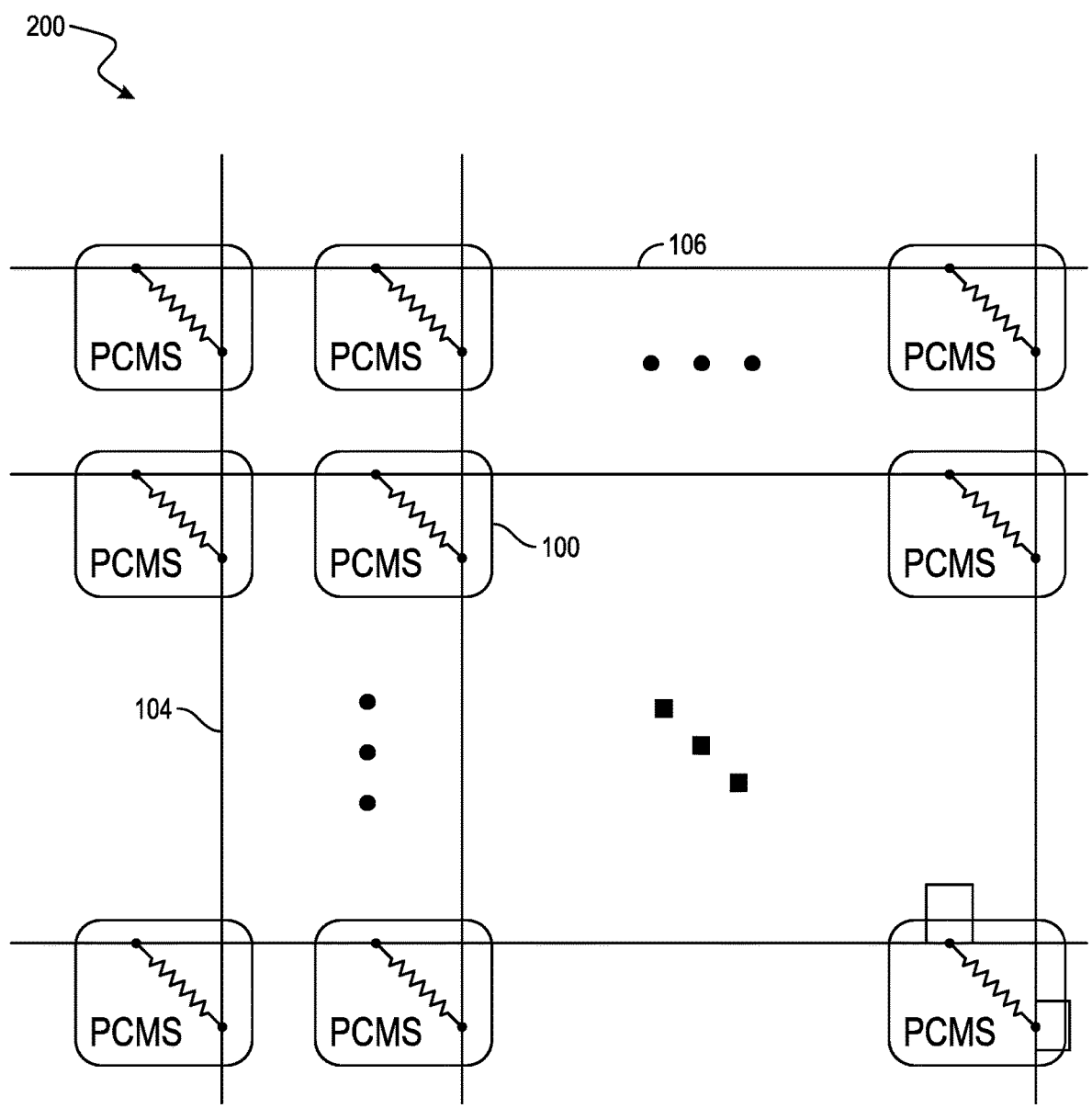
FIG. 2 depicts a cross point memory array including a plurality of PCM cells according to an exemplary embodiment.

FIG. 2 depicts a cross point memory array 200 including a plurality of PCM cells 100, column wires 104, and row wires 106 according to an exemplary embodiment. A dense array of PCM cells 100 (e.g., 4,096×4,096) enables storage of megabits of data, especially considering that each PCM cell can store a non-binary (e.g., ternary) value.

We have found that GeAsSe material (which has not been previously used in PCM cells) has a much lower leakage current in OTS applications than does GeAsTe. However, the electrical properties of a GeAsSe lack a desirable degree of thermal stability—the electrical properties, even in the same phase, are quite dependent on the operating temperature of the material. We have also found that adding a Si dopant in small quantities improves thermal stability of the electrical properties of SiGeAsSe. We have further found that SiSe(As) base material is easy to oxidize to release $AsH_3$ or $SeH_2$ when the material is exposed to moisture in the air after thin film deposition or processing. Emission of either gas will change the electrical properties of the base material. For example, either of the following reactions would happen when the SiSe(As) film is exposed to moisture:

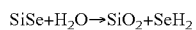

$SiSe+H_2O \rightarrow SiO_2+SeH_2$

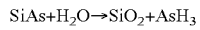

$SiAs+H_2O \rightarrow SiO_2+AsH_3$

If the material is oxidized or not stabilized, the device becomes very leaky and gives much higher off-state current. Adding any highly reactive element (e.g., Al, Si, or possibly Ti) into GeSeAs materials also is expected to enhance thermal stability but to also cause outgassing.

Thus, the thermally stable SiGeAsSe is not chemically (moisture) stable. For thin films, oxidation can be avoided with a thick capping layer; however, such a layer cannot be applied on material during fabrication, when electrical properties could degrade before testing is possible.

In other research, we have learned that AlAs, similar to AsSeGeSi, oxidizes very easily to release $AsH_3$ when exposed to moisture, and that by adding Ga (up to about 10%) in AlAs, the oxidation rate can be reduced. Accordingly, we experimented to find whether a dopant could be added into AsSeGeSi system to chemically stabilize the electrical properties for cross-point memory operation.

We found that Te or S dopants in effective amounts (i.e., from 1% to 10% proportion by atomic percentage) can reduce oxidation and gas emission from SiSe(As) compositions, and more specifically from AsGeSeSi compositions, and stabilize the electrical properties.

Figure 3A:
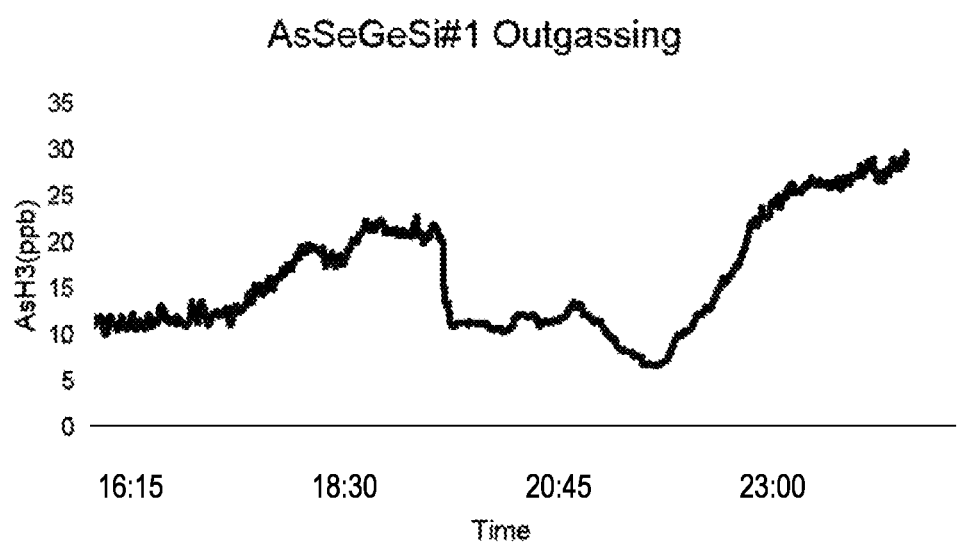
FIG. 3A depicts outgassing as a function of time from a SiSe(As) composition.
Figure 3B:
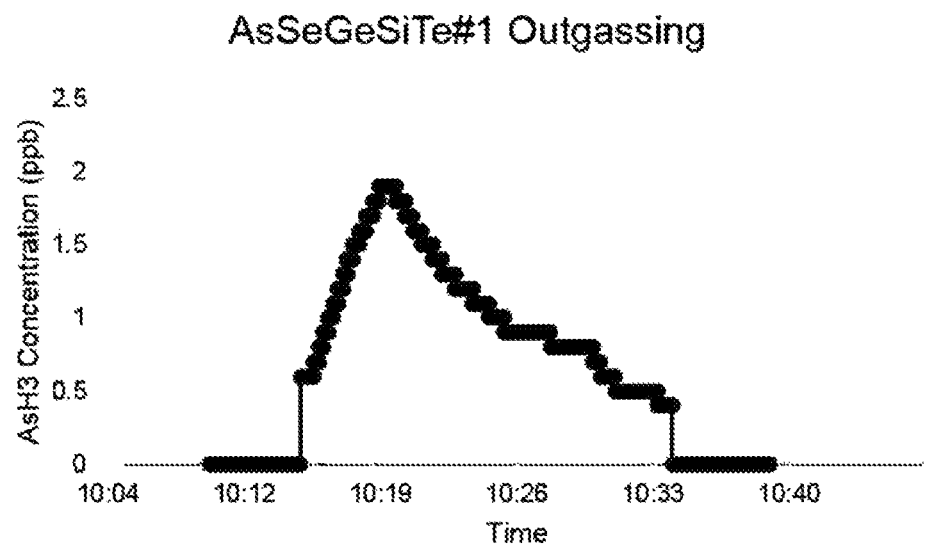
FIG. 3B depicts outgassing as a function of time from a composition according to an exemplary embodiment.

For example, by adding an effective amount of Te to the SiGeSeAs base material, emission of arsine can be reduced as shown in comparative FIGS. 3A and 3B. FIG. 3A shows a time plot of arsine emission rate in parts-per-million (ppm) atmospheric at given test conditions from an AsGeSeSi composition. In contrast, FIG. 3B shows a time plot of arsine emission in ppm under the same given test conditions from an AsGeSeSiTe composition according to an embodiment of the invention. Specifically, FIG. 3B shows a time plot of arsine emission for a composition that consists essentially of about 30% As, about 15% Ge, about 40% Se, about 10% Si, and about 5% Te by atomic percent.

The test conditions for both plots included sputtering the materials onto silicon wafer substrates in process chamber and transfer to a loadlock from process chamber, injecting uncontrolled air into the loadlock chamber in a continuous (equalizing) flow, and then sampling the gas in the chamber over a period of time until off-gassing was determined to continue or stop. Notably, off-gassing for the AsGeSeSiTe composition (FIG. 3B) stopped within about six minutes, whereas off-gassing for the composition without Te dopant (FIG. 3A) continued for more than seven hours. Thus, the Te dopant passivated the composition under oxidizing conditions. It is expected that similar beneficial results could be obtained for compositions comprising As, Ge, Se, and Si in combination with Te and other elements.

Similarly, oxidation can be passivated and emission of arsine can be reduced by adding an effective amount of S (from 1% to 10% proportion by atomic percent) to the SiGeSeAs base material to stabilize the electrical properties.

It is believed that 1% dopant is the minimum effective amount for chemical stability, whereas it is believed that dopant percentage greater than 10% would undesirably increase leakage current and/or alter the phase transition temperature for PCM or OTS formed from such a composition.

Given the discussion thus far, it will be appreciated that, in general terms, an exemplary composition of matter, according to an aspect of the invention, consists essentially of Si, Ge, Se, As, and an amount of a chalcogen that is effective to passivate oxidation of the composition in the presence of water vapor, wherein the chalcogen is selected from the list consisting of: Te and S. In one or more embodiments, the chalcogen is S. In one or more embodiments, the chalcogen is Te. In one or more embodiments, the effective amount of the chalcogen is greater than 1% by atomic percent. In one or more embodiments, the effective amount of the chalcogen is less than 10% by atomic percent. In one or more embodiments, the composition of matter comprises 10% Si, 15% Ge, 40% Se, 30% As, and 5% chalcogen by atomic percent.

According to another aspect, an exemplary cross point memory apparatus comprises a column wire; a top electrode adjacent to and connected in electrical communication with the column wire; an ovonic threshold switch (OTS) adjacent to and connected in electrical communication with the top electrode; a middle electrode adjacent to and connected in electrical communication with the ovonic threshold switch (OTS); a phase change memory (PCM) adjacent to and connected in electrical communication with the middle electrode; a bottom electrode adjacent to and connected in electrical communication with the PCM; and a row wire adjacent to and connected in electrical communication with the bottom electrode. The OTS comprises a thin film composed of the inventive composition of matter.

According to another aspect, an exemplary method comprises forming a bottom electrode; forming a phase change memory (PCM) adjacent to and connected in electrical communication with the bottom electrode; forming a middle electrode adjacent to and connected in electrical communication with the PCM; forming an ovonic threshold switch (OTS) adjacent to and connected in electrical communication with the middle electrode; and forming a top electrode adjacent to and connected in electrical communication with the OTS. The OTS comprises a thin film composed of the inventive composition of matter.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A composition of matter consisting essentially of:
   Si, Ge, Se, As, and between 1 atomic percent and 10 atomic percent of a chalcogen that is effective to passivate oxidation of the composition in the presence of water vapor, wherein the chalcogen is selected from the list consisting of: Te and S.

2. The composition of matter according to claim 1, wherein the chalcogen is S.

3. The composition of matter according to claim 1, wherein the chalcogen is Te.

4. The composition of matter according to claim 1, consisting essentially of 10% Si, 15% Ge, 40% Se, 30% As, and 5% chalcogen by atomic percent.

5. A cross point memory apparatus comprising:
   a column wire;
   a top electrode adjacent to and connected in electrical communication with the column wire;
   an ovonic threshold switch (OTS) adjacent to and connected in electrical communication with the top electrode;
   a middle electrode adjacent to and connected in electrical communication with the ovonic threshold switch (OTS);
   a phase change memory (PCM) adjacent to and connected in electrical communication with the middle electrode;
   a bottom electrode adjacent to and connected in electrical communication with the PCM; and
   a row wire adjacent to and connected in electrical communication with the bottom electrode;
   wherein the OTS comprises a thin film consisting essentially of Si, Ge, Se, As, and between 1 atomic percent and 10 atomic percent of a chalcogen that is effective to passivate oxidation of the thin film in the presence of water vapor, wherein the chalcogen is selected from the list consisting of: Te and S.

6. The apparatus of claim 5, wherein the chalcogen is S.

7. The apparatus of claim 5, wherein the chalcogen is Te.

8. The apparatus of claim 5, the thin film consisting essentially of 10% Si, 15% Ge, 40% Se, 30% As, and 5% chalcogen by atomic percent.

9. A method comprising:
   forming a bottom electrode;
   forming a phase change memory (PCM) adjacent to and connected in electrical communication with the bottom electrode;
   forming a middle electrode adjacent to and connected in electrical communication with the PCM;
   forming an ovonic threshold switch (OTS) adjacent to and connected in electrical communication with the middle electrode; and
   forming a top electrode adjacent to and connected in electrical communication with the OTS
   wherein the OTS comprises a thin film consisting essentially of Si, Ge, Se, As, and between 1 atomic percent and 10 atomic percent of a chalcogen that is effective to passivate oxidation of the thin film in the presence of water vapor, wherein the chalcogen is selected from the list consisting of: Te and S.

10. The method of claim 9 wherein the chalcogen is Te.

11. The method of claim 9 wherein the chalcogen is S.

12. The method of claim 9 wherein the thin film consists essentially of 10% Si, 15% Ge, 40% Se, 30% As, and 5% chalcogen by atomic percent.

* * * * *